United States Patent
Xu et al.

(10) Patent No.: US 9,490,034 B1
(45) Date of Patent: Nov. 8, 2016

(54) CENTRALIZED MEMORY REPAIR BLOCK

(71) Applicant: ORACLE INTERNATIONAL CORPORATION, Redwood City, CA (US)

(72) Inventors: Pangjie Xu, Santa Clara, CA (US); Hoyeol Cho, Palo Alto, CA (US); Ioannis Orginos, Sunnyvale, CA (US)

(73) Assignee: ORACLE INTERNATIONAL CORPORATION, Redwood City, CA (US)

( * ) Notice: Subject to any disclaimer, the term of this patent is extended or adjusted under 35 U.S.C. 154(b) by 0 days.

(21) Appl. No.: 14/829,491

(22) Filed: Aug. 18, 2015

(51) Int. Cl.
*G11C 7/00* (2006.01)
*G11C 7/06* (2006.01)
*G11C 8/00* (2006.01)
*G11C 29/00* (2006.01)

(52) U.S. Cl.
CPC ............. *G11C 29/785* (2013.01); *G11C 29/76* (2013.01)

(58) Field of Classification Search
USPC ................. 365/189.02, 189.07, 200, 230.02, 365/230.03
See application file for complete search history.

(56) References Cited

U.S. PATENT DOCUMENTS

| | | | | |
|---|---|---|---|---|
| 5,153,880 A * | 10/1992 | Owen | ................ | G11C 29/789 365/200 |
| 7,251,173 B2 * | 7/2007 | Lunde | ................ | G11C 29/808 365/200 |
| 7,684,267 B2 * | 3/2010 | Orginos | ............ | G11C 29/4401 365/200 |

* cited by examiner

*Primary Examiner* — Trong Phan
(74) *Attorney, Agent, or Firm* — Marsh Fischmann & Breyfogle LLP; Daniel J. Sherwinter

(57) ABSTRACT

Embodiments provide centralized redundancy block repair for memory circuits. Certain embodiments are implemented in context of high-performance memory, such as last-level cache design, where the primary memory bank often uses high-density memory cells ("bitcells") and supports long self-bitline structures to increase compactness. In such contexts, it can be difficult to finish read operations within a single cycle, even when the entire cache is divided into small bank pieces. Bank-interleaved structure in clusters can be implemented to allow access to different memory banks in consecutive cycles, thereby achieving overall single circle throughput (i.e., the latency can be masked by the interleaving). Accordingly, some embodiments of the centralized block repair can support bank interleaved access, for example, with a strict single-cycle throughput. Some embodiments can also support other features, such as row repair and/or column repair.

19 Claims, 4 Drawing Sheets

CENTRALIZED MEMORY REPAIR BLOCK

FIELD

Embodiments relate generally to memory circuits, and, more particularly, to centralized repair blocks in memory circuits.

BACKGROUND

Modern high-end microprocessors often demand larger amounts of cache memory (e.g., level 3 cache, or "L3" cache) to boost performance. Typically, memory cell sizes decrease as the microprocessor technology scales; and variation in the memory cell can be inversely proportional to the area that it takes. Accordingly, single bit failures inside large memory products are becoming a more critical issue. To maintain a desired manufacturing yield for such products, many such products include redundancy repair inside the memory to minimize process variation at some reasonable overhead.

Because bit failures can be statistically randomized across an entire memory array (the bit failure can occur in any bitcell of any sub-array of the memory), conventional redundancy approaches tend to add redundancy in each sub-array of the memory. For example, the redundancy can be configured for row repair or column repair, which can address bit failures in a manner that is fairly straightforward to implement, but can also add appreciable overhead and cost. Another conventional type of redundancy is duplicated block repair, which can be useful, for example, in memories that have extremely high clock frequencies, bank-interleaved access for supporting single-cycle throughput, and multi-cycle latency. Traditionally, the duplicated block repair has the same design as the primary memory arrays and uses multiple instantiations (e.g., the same number as the primary banks) in the cluster to meet throughput requirements.

BRIEF SUMMARY

Among other things, systems and methods are described for providing centralized redundancy block repair. Certain embodiments are implemented in context of high-performance memory, such as last-level cache design, where the primary memory bank often uses high-density memory cells ("bitcells") and supports long self-bitline structures to increase compactness. In such contexts, it can be difficult to finish read operations within a single cycle, even when the entire cache is divided into small bank pieces. Bank-interleaved structure in clusters can be implemented to allow access to different memory banks in consecutive cycles, thereby achieving overall single circle throughput (i.e., the latency can be masked by the interleaving). Accordingly, some embodiments of the centralized block repair can support bank interleaved access, for example, with a strict single-cycle throughput. Some embodiments can also support other features, such as row repair and/or column repair.

According to one set of embodiments, a method is provided for centralized block repair in a memory. The method includes: receiving, substantially concurrently at a primary memory block and at a centralized repair block, a memory address associated with a plurality of primary data bits stored in primary bitcells of the primary memory block; outputting the primary data bits from the primary memory block onto a primary data bus in response to the receiving, such that each of the primary data bits has a respective bit position on the primary data bus; identifying a set of repair bitcells of a repair memory array of the centralized repair block that correspond to the memory address; outputting a set of repair data bits stored in the identified set of repair bitcells onto a repair data bus in response the receiving; determining, by a comparison logic circuit of the centralized repair block, that the memory address is associated with a known-defective bitcell; generating, by the comparison logic circuit in response to the determining, a multiplexing signal that identifies one of a plurality of repair resources of the repair memory array and identifies a bit position of the known-defective bitcell; and outputting, in response to the determining and according to the multiplexing signal, a plurality of composite data bits onto a composite data bus. Outputting the composite data bits can include: identifying a defective one of the primary data bits corresponding to the identified bit position of the known-defective bitcell; identifying one of the repair data bits according to the identified repair resource; and multiplexing the plurality of primary data bits with one of the repair data bits by replacing the identified defective one of the primary data bits with the identified one of the repair data bits.

According to another set of embodiments, a memory system is provided for centralized block repair in a memory. The system includes a centralized repair block that has: a repair memory array, a comparison logic circuit, and a multiplexer. The repair memory array is coupled with a repair data bus, includes a set of repair bitcells arranged into a plurality of repair resources, and is operable to output, onto the repair data bus, a set of repair data bits stored in a set of the repair bitcells that corresponds to a memory address signal received substantially concurrently with receipt of the memory address signal by a primary memory block, wherein the primary memory block is operable to output, onto a primary data bus in accordance with the memory address signal, a plurality of primary data bits stored in corresponding primary bitcells, such that each of the primary data bits has a respective bit position on the primary data bus. The comparison logic circuit is operable to generate, in response to determining that the memory address signal is associated with a known-defective bitcell, a multiplexing signal that identifies one of the repair resources and identifies a bit position of the known-defective bitcell. The multiplexer is coupled with the primary data bus, the repair data bus, and the comparison logic circuit; and is operable to output, in response to the determining and according to the multiplexing signal, a plurality of composite data bits onto a composite data bus. The outputting by the multiplexer can include: identifying a defective one of the primary data bits corresponding to the identified bit position of the known-defective bitcell: identifying one of the repair data bits according to the identified repair resource; and multiplexing the plurality of primary data bits with one of the repair data bits by replacing the identified defective one of the primary data bits with the identified one of the repair data bits.

BRIEF DESCRIPTION OF THE DRAWINGS

The present disclosure is described in conjunction with the appended figures.

Figure 1:
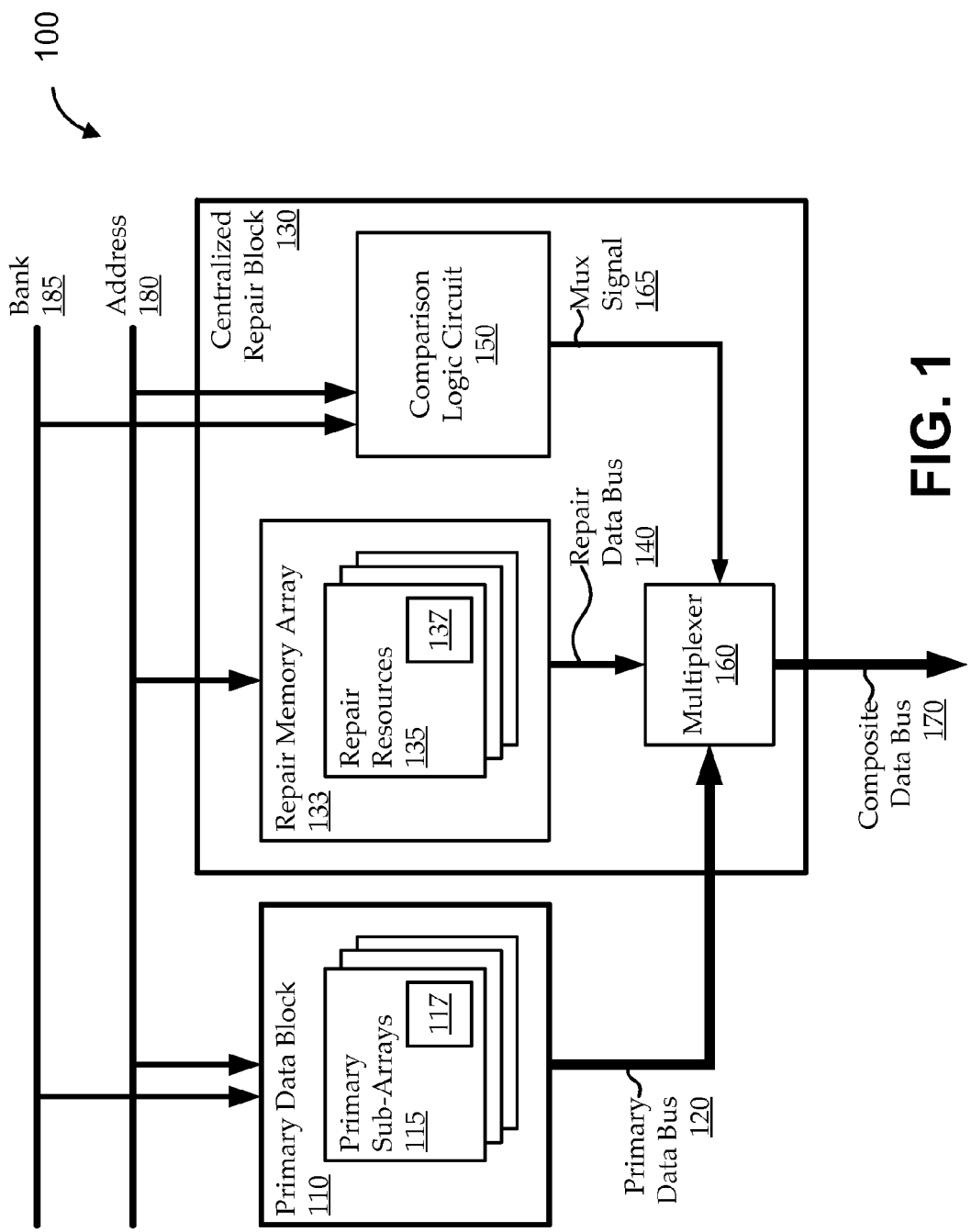
FIG. 1 shows a block diagram of an illustrative memory system for implementing centralized repair of a memory, according to various embodiments.

In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

In the following description, numerous specific details are set forth to provide a thorough understanding of the present invention. However, one having ordinary skill in the art should recognize that the invention may be practiced without these specific details. In some instances, circuits, structures, and techniques have not been shown in detail to avoid obscuring the present invention.

Some embodiments are implemented within a larger context, such as within a high-performance microprocessor, which can perform various functions, such as using one or more cores to perform operations typically associated with a traditional central processing unit (CPU). Such microprocessors can include one or more die in a mechanical package, each having one or more cores, one or more cache memory arrays (e.g., primary (L1) cache, secondary (L2) cache, etc.), and additional circuitry and connectivity for proper operation of the microprocessor. The cache memory arrays can have cache lines comprised of multiple bits used to store previously accessed instructions or data, and are typically comprised of fast Static Random Access Memory (SRAM), or the like. Each core can have dedicated cache memory, shared cache memory, and/or a combination thereof. Other contexts for various embodiments can include Application Specific Integrated Circuits (ASICs), Field Programmable Gate Arrays (FPGAs), and/or any suitable semiconductor devices that include memory arrays.

In these and other contexts, fabrication of the semiconductor devices and their memory arrays can be complicated by defects (e.g., inherent in the fabrication process), which can result in a number of defective memory cells within the memory array. The defects can involve a single bitcell (a single physical memory storage cell), multiple physically related bitcells (e.g., an entire row and/or column of the memory array), and/or multiple bitcells located throughout the memory. As described above, some conventional approaches for addressing bitcell defects involve adding redundant rows, columns, and/or entire blocks within each bank of cells. For example, banks of fuses, shift registers, or the like have been used to disable defective cells and enable redundant cells. In post-fabrication processing, defective cells can be disabled, and redundant cells can be enabled, by "setting" the fuses with a laser and/or by other techniques. The redundant bitcells, and related circuitry and processing, can add overhead, complexity, and/or cost to the memory design and implementation.

Embodiments described herein provide centralized redundancy block repair. Certain embodiments are implemented in context of high-performance memory, such as last-level cache design, where the primary memory bank often uses high-density memory cells ("bitcells") and supports long self-bitline structures to increase compactness. In such contexts, it can be difficult to finish read operations within a single cycle, even when the entire cache is divided into small bank pieces. The bitline development speed can be determined by a bitline load and a bitcell pull-down current, as: $\Delta V/\Delta t = \text{Bit count} * \text{Bitline Cap}/\text{Bitcell Current}$. Bank-interleaved structure in clusters can be implemented to allow access to different memory banks in consecutive cycles, thereby achieving overall single circle throughput (i.e., the latency can be masked by the interleaving). Accordingly, some embodiments of the centralized block repair can support bank interleaved access, for example, with a strict single-cycle throughput. Some embodiments can also support other features, such as row repair and/or column repair.

FIG. 1 shows a block diagram of an illustrative memory system 100 for implementing centralized repair of a memory, according to various embodiments. As illustrated, the memory system 100 can include a primary memory block 110 and a centralized repair block 130. Each of the primary memory block 110 and the centralized repair block 130 can be coupled with an address line 180 (e.g., and a bank line 185, where the primary memory block 110 includes multiple banks).

The primary memory block 110 includes one or more primary memory sub-arrays 115 (or "banks"), each including multiple physical memory cell, or primary bitcells 117. Each primary bitcell 117 can store a bit of data, referred to as a primary data bit. In response to a memory input/output (I/O) function (e.g., a read), the primary memory block 110 can output a set of the primary data bits to a primary data bus 120. The desired primary bitcell 117 can be addressed using a memory address received from an address line 180 (e.g., and a bank line 185, where there are multiple primary memory sub-arrays 115). In one implementation, each primary memory sub-array 115 of the primary memory block 110 can have 256 rows and 512 (i.e., 8×64) columns, where the primary data bus 120 is 64 bits wide. In such an implementation, an 11-bit memory address can be used to address any bitcell in a primary memory sub-array 115 by using eight bits for addressing the 128 rows and three bits for addressing eight columns. When one of the eight columns is identified, its associated 64 bits can be output to the primary data bus 120. Notably, each bit output to the primary data bus 120 has a corresponding bit position (e.g., from position 0 to 63).

The centralized repair block 130 can include a repair memory array 133, a comparison logic circuit 150, and an I/O multiplexer 160. The repair memory array 133 can include one or more repair resources 135, each having a number of repair bitcells 137. As described more fully below, repair data can be output from the repair memory array 133 onto a repair data bus 140, a multiplexing signal 165 can be output from the comparison logic circuit 150, and the repair data output and the multiplexing signal 165 can be used by the I/O multiplexer 160 to generate and output composite data onto a composite data bus 170. In some implementations, the repair memory array 133 (e.g., to meet single-cycle throughput), can use the same bitcell type as that of the primary bitcells 117, or any other suitable high-performance bitcell (e.g., high performance single port cell or dual port cell, cells using higher read current). In such implementations (e.g., depending on the architecture, size, etc. of the repair memory array 133), performance of the repair memory array 133 (e.g., throughput) can be the same or better than that of the primary memory block 110.

The number of repair resources 135 can be selected by balancing a desire to support an unknown number of I/O repairs (i.e., the number of defective primary bitcells 117 may not be known until after the memory system 100 is manufactured and tested). For example, ten repair resources 135 can be used to repair ten defective I/Os (e.g., ten defective primary bitcells 117 or ten defective rows or columns of primary bitcells 117). The repair resources 135 can be arranged to repair a certain type of defective I/O. Some embodiments implement each repair resource 135 as an array of repair bitcells 137 corresponding to (e.g., matching, or being some simple fraction of) dimensions of the primary memory sub-arrays 115. For example, if each primary memory sub-array 115 has 256 rows and 512 (i.e., 8×64) columns, each repair resource 135 can be an array of 256 rows by 8 columns, and the repair bitcells 137 in each repair resource 135 can be used to duplicate data stored in the primary bitcells 117 of the corresponding primary memory sub-array 115. In such an implementation, the same 11-bit memory address can be used to address the primary memory block 110 and the repair memory array 133; but the memory address will correspond to a 64-bit output from one of the primary memory sub-arrays 115 and a single-bit output from one (or each) repair resource 135, as described below. Alternatively, each repair resource 135 can correspond to one of the rows of a primary memory sub-array 115, and can duplicate the primary bitcells 117 of the corresponding row in its repair bitcells 137 (e.g., in eight repair bitcells 137). Alternatively, each repair resource 135 can correspond to one of the columns of a primary memory sub-array 115, and can duplicate the primary bitcells 117 of the corresponding column in its repair bitcells 137 (e.g., in 256 repair bitcells 137). Some implementations include multiplexing within the repair memory array 133. For example, the long self-bitline of each column can make it undesirable to perform column repair on a full column, and the column can, instead, be cut into several segments (e.g. 4 segments). In such implementations, some of the memory address bits (e.g., two of the row address bits) can be used for column multiplexing (e.g., two address bits can be used to select among four columns), thereby improving read delay.

Embodiments of the comparison logic circuit 150 can determine whether an I/O request is invoking a known-defective I/O (e.g., one or more primary bitcell 117), and can output information with which to use the repair resources 135 to repair the known-defective I/O. The comparison logic circuit 150 can receive the memory address from the address line 180 (and bank line 185, where there are multiple primary memory sub-arrays 115), and can determine whether the memory address corresponds to (e.g., is or includes) a known-defective primary bitcell 117. For example, during manufacturing testing of the primary memory block 110, certain primary bitcells 117 can be identified as defective, and addresses corresponding to those defective primary bitcells 117 can be stored at (or in relation to) the comparison logic circuit 150 (e.g., as a lookup table, or in any suitable manner). The determination of the comparison logic circuit 150 can be based on the stored information. In some embodiments, the comparison logic circuit 150 can further determine, according to its stored information (or in any other suitable manner) which of the repair resources 135 corresponds to the known-defective I/O (i.e., which repair resource 135 is being used to duplicate data of the known defective primary bitcell(s) 117) and which bit position(s) in the primary data output on the primary data bus 120 correspond to the known-defective I/O. As illustrated, the comparison logic circuit 150 can generate a multiplexing signal 165 that identifies the corresponding one of the repair resources and identifies the bit position of the known-defective data bit.

Embodiments of the I/O multiplexer 160 are coupled with the primary data bus 120, the repair data bus 140, and the comparison logic circuit 150. In some embodiments, when the comparison logic circuit 150 determines that no repair is needed (i.e., the memory address does not correspond to any known-defective I/O), the I/O multiplexer 160 can effectively pass the data output from the primary memory block 110, so that the data on the composite data bus 170 matches the data on the primary data bus 120. When the comparison logic circuit 150 determines that a repair is needed (i.e., the memory address corresponds to a known-defective I/O), the I/O multiplexer 160 can output a repaired set of output data onto the composite data bus 170 according to the multiplexing signal 165 received from the comparison logic circuit 150. Embodiments of the I/O multiplexer 160 can identify a defective one of the primary data bits corresponding to the identified bit position on the primary data bus 120 of the known-defective primary bitcell 117 data; and can identify one of the repair data bits on the repair data bus 140 according to the identified repair resource. The I/O multiplexer 160 can multiplex the primary data bits with one of the repair data bits by replacing the identified defective one of the primary data bits with the identified one of the repair data bits. The multiplexed data can be output as composite data on the composite data bus 170.

Figure 2:
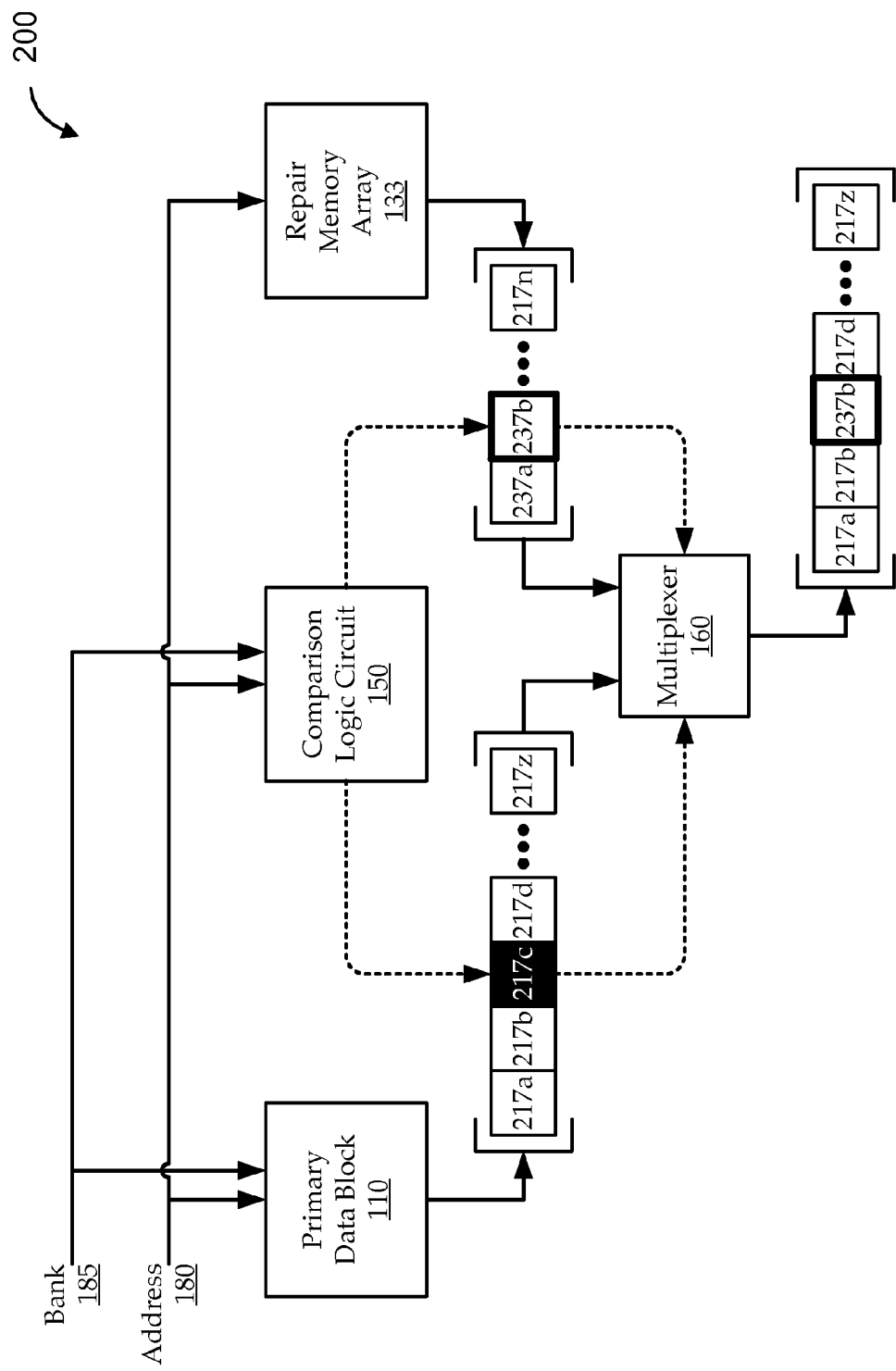
FIG. 2 shows an example data flow of centralized memory repair functionality, according to some embodiments.

For the sake of illustration, FIG. 2 shows an example data flow 200 of centralized memory repair functionality, according to some embodiments. As illustrated, the primary memory block 110 can output primary data bits 217 in accordance with a received memory address from an address line 180 and bank line 185 (e.g., the bank and address lines provide addressing to identify a particular set of primary bitcells from which the primary data bits 217 are read out). The primary data bits 217 can be output to a primary data bus of a particular width (illustrated as "z" bits wide, so that the output primary data bits 217 range from 217a to 217z). The repair memory array 133 can output repair data bits 237 in accordance with a received memory address from the address line 180 (e.g., in various embodiments, some or all of the addressing information can be used, depending on the architecture of the repair resources). For example, a particular repair bit cell is read out from each repair resource, such that the number of output repair data bits 237 can correspond to the number of repair resources. Each repair resource in the repair memory array 133 redundantly stores the data of its corresponding I/O in the primary memory block 110. The repair data bits 237 can be output to a repair data bus of a particular width (illustrated as "n" bits wide, so that the output repair data bits 237 range from 237a to 237n).

The comparison logic circuit 150 can also receive the addressing information (i.e., the memory address) from the address line 180 and the bank link 185 to determine, as described above, whether the addressing information corresponds to a known-defective I/O. It is assumed, in the illustrated scenario, that the comparison logic circuit 150 determines that the memory address corresponds to a known-defective primary bitcell; that the known-defective primary bitcell is output to the bit position corresponding to output primary data bit 217c; and that the known-defective primary bitcell corresponds to a repair resource that outputs to the position shown as repair data bit 237b. Accordingly, the I/O multiplexer 160 can output composite data to a composite data bus, so that primary data bit 217c corresponding to the known-defective primary bitcell is replaced by the repair data bit 237b corresponding to the identified repair resource for repairing that known-defective primary bitcell. Thus, the composite data bus can be the same width as that of the primary data bus (e.g., "z" bits wide).

Figure 3:
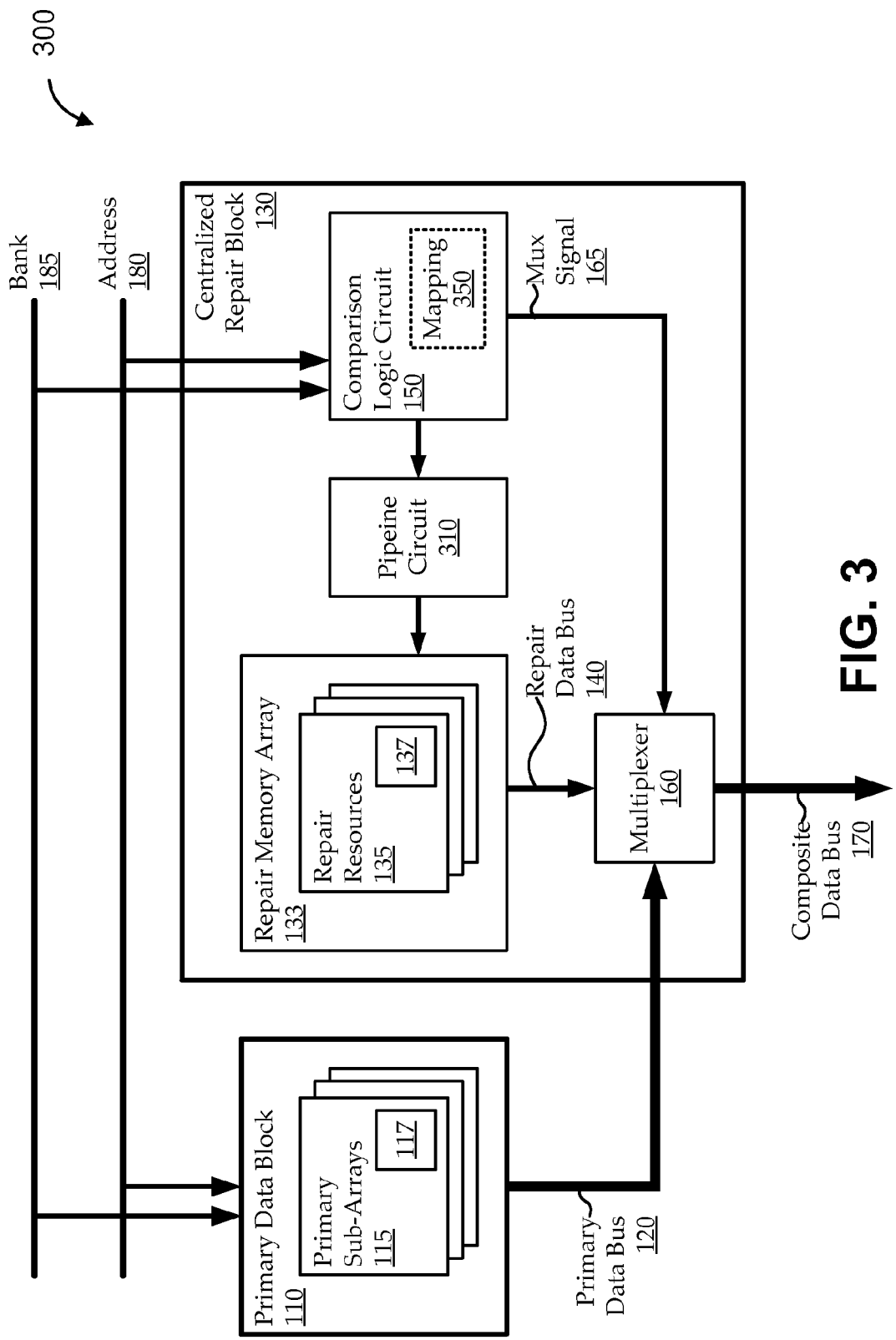
FIG. 3 shows another block diagram of an illustrative memory system for implementing centralized repair of a memory, according to various embodiments.

FIGS. 1 and 2 show illustrative architectures and functionality, but are not intended to limit the scope of embodiments to only those implementations. FIG. 3 shows another block diagram of an illustrative memory system 300 for implementing centralized repair of a memory, according to various embodiments. To avoid over-complicating the description, components of the system 300 that can be implemented in the same, or a similar, manner as corresponding components of FIG. 1 are illustrated with the same reference identifiers and are not re-described. For example, as in FIG. 1, the memory system 300 can include a primary memory block 110 and a centralized repair block 130, each coupled with an address line 180 and a bank line 185. The primary memory block 110 can include one or more primary memory sub-arrays 115, each with multiple primary bitcells 117, and can output a set of primary data bits (corresponding to data stored in the primary bitcells 117) to a primary data bus 120. The centralized repair block 130 can include a repair memory array 133 (with one or more repair resources 135, each having a number of repair bitcells 137), a comparison logic circuit 150, and an I/O multiplexer 160. Repair data can be output from the repair memory array 133 onto a repair data bus 140, a multiplexing signal 165 can be output from the comparison logic circuit 150, and the repair data output and the multiplexing signal 165 can be used by the I/O multiplexer 160 to generate and output composite data onto a composite data bus 170.

Some embodiments described above can effectively use the same (or easily modified) memory address to output data from both the primary memory block 110 and the repair memory array 133 in a single cycle (e.g., or effectively in a single cycle using bank interleaving, or the like). Some other embodiments use additional translation between the memory address and the repair resources 135 to provide certain functionality. As illustrated, such implementations can include stored mapping data 350 in the comparison logic circuit 150. Some such implementations can further include an additional pipeline (shown as pipeline circuit 310) between the comparison logic circuit 150 and the repair memory array 133. The pipeline circuit 310 can be implemented in any suitable manner, for example, as a flip-flop.

For example, such implementations can be used to provide row repair and/or column repair. Repairing an entire row or column failure can be useful for addressing certain types of defective bitcell distributions. Row repair can rely on comparison logic between an incoming row address and a stored repair address before the repair memory array 133 can be read, which can hurt the wordline path delay. The pipeline circuit 310 can be used to address this wordline path delay. For example, the large primary memory block 110 tends to experience relatively long latencies; the delay to access the repair memory array 133 (which has smaller latency) can be performed in parallel with the primary access, and the repair data can be multiplexed by the I/O multiplexer 160. This can hide any added delay from the redundancy access (i.e., access of the centralized repair block 130) and can reduce area and power overhead of the approach.

For the sake of illustration, each repair resource 135 can be arranged as a row of repair bitcells 137 that are redundant to a row of primary bitcells 117. As described above, the comparison logic circuit 150 can determine whether the memory address invokes a known-defective I/O, which can be a defective row of primary bitcells 117. The mapping data 350 can indicate which of the repair resource 135 rows corresponds to the known-defective primary row. The comparison logic circuit 150 can output a signal to the pipeline circuit 310 that enables the pipeline and indexes the appropriate repair resource 135. In response, the pipeline circuit 310 can generate an address (e.g., a wordline address) to cause the repair memory array 133 to output the appropriate row of repair bitcell 137 data to the repair data bus 140. The I/O multiplexer 160 can multiplex the repair row data in with the primary data from the primary data bus 120, as appropriate.

Similar techniques can be used to implement column repair. For example, each repair resource 135 can be arranged as a column of repair bitcells 137 that are redundant to a column of primary bitcells 117. In some implementations, each repair resource 135 can be arranged as a column of repair bitcells 137 that are redundant to a segment of a column of primary bitcells 117. For example, each known-defective column can be cut into segments (e.g., four, eight, etc.), so that multiple repair resources correspond to respective segments of a same column in the primary memory block 110. Column multiplexing can then be used to select the appropriate repair columns from the repair memory array 133. In the row repair embodiments, the comparison logic circuit 150 can output a signal to the pipeline circuit 310 that enables the pipeline and indexes the appropriate repair resource 135; and, in response, the pipeline circuit 310 can generate an address (e.g., a bitline address, in this case) to cause the repair memory array 133 to output the appropriate column(s) of repair bitcell 137 data to the repair data bus 140. The I/O multiplexer 160 can multiplex the repair column data in with the primary data from the primary data bus 120, as appropriate.

Figure 4:
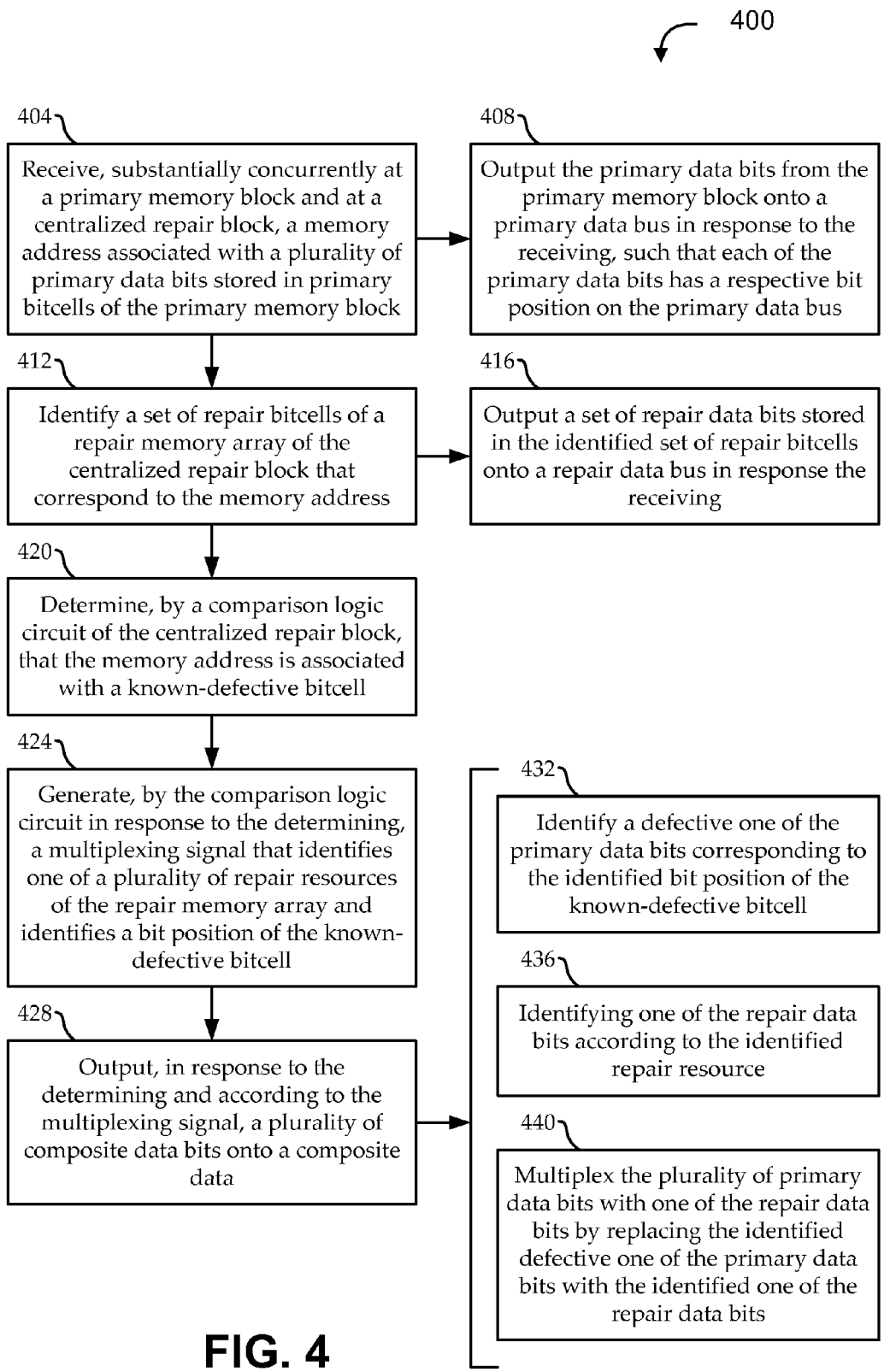
FIG. 4 shows a flow diagram of an illustrative method for implementing centralized block repair in a memory, according to various embodiments.

FIG. 4 shows a flow diagram of an illustrative method 400 for implementing centralized block repair in a memory, according to various embodiments. Embodiments can be implemented by a memory system, such as the ones described with reference to FIGS. 1 and 3. Embodiments of the method 400 begin at stage 404 by receiving, substantially concurrently at a primary memory block and at a centralized repair block, a memory address associated with multiple primary data bits stored in primary bitcells of the primary memory block. For example, each of the primary memory block and the centralized repair block is coupled with an address (and bank) line, from which it receives the memory address. At stage 408, the primary data bits can be output from the primary memory block onto a primary data bus in response to the receiving, such that each of the primary data bits has a respective bit position on the primary data bus. For the sake of illustration, the primary memory block can be arranged in banks of memory sub-arrays, each having 256 rows and 8×64 columns, with a 64-bit-wide primary data bus. An 11-bit address can include eight bits for addressing the 128 rows and three bits for addressing eight columns, thereby addressing 64 bits of output.

At stage 412, embodiments can identify a set of repair bitcells of a repair memory array of the centralized repair block that corresponds to the memory address. A set of repair data bits stored in the identified set of repair bitcells can be output at stage 416 onto a repair data bus in response the receiving. Embodiments of the repair memory array are implemented so that the repair bitcells are arranged in so-called repair resources, as described above. In some embodiments, each repair resource is a sub-array of the repair bitcells addressable by the memory address. Such embodiments, at stage 412, can identify the set of repair bitcells that corresponds to the memory address from among the sub-array of the repair bitcells corresponding to the repair resource identified by the comparison logic circuit. In other embodiments, the repair memory array has N repair resources, each being a sub-array of the repair bitcells addressable by the memory address. In such embodiments, at stage 412, one respective repair bitcell can be identified from each of the repair resources as corresponding to the memory address, thereby identifying N repair bitcells: and, at stage 416, the N repair data bits stored in the identified N repair bitcells can be output onto the repair data bus. In other embodiments, each repair resource is a row of repair bitcells that duplicates data of a corresponding row of the primary memory block. Such embodiments can, at stage 412, identify the set of repair bitcells by mapping the memory address to one of the rows of repair bitcells according to a mapping stored by the centralized repair block; and can, at stage 416, output the set of repair data bits stored in the identified row of repair bitcells onto the repair data bus. In other embodiments, each repair resource is a column of repair bitcells that duplicates data of a segment of a corresponding column of the primary memory block. Such embodiments can, at stage 412, identify the set of repair bitcells by mapping the memory address to one of the columns of repair bitcells according to a mapping stored by the centralized repair block; and can, at stage 416, output the repair data bits stored in the identified column of repair bitcells onto the repair data bus. Certain such embodiments can segment each column (e.g., into for segments each), and can use column multiplexing to address an appropriate segment of the column for output. For example, a portion of the received memory address into a column multiplexing selector (e.g., two bits of the received memory address can be translated for use in addressing one of four segments of each repair resource column).

At stage 420, embodiments can determine, by a comparison logic circuit of the centralized repair block, that the memory address is associated with a known-defective bitcell. For example, during manufacturing testing of the primary data block, bitcells can be identified as defective, and data usable for identifying those defective bitcells can be stored to the comparison logic circuit as known-defective bitcells. In response to the determining, at stage 424, the comparison logic circuit can generate a multiplexing signal that identifies one of a number of repair resources of the repair memory array and identifies a bit position of the known-defective bitcell (e.g., in a 64-bit-wide primary data bus, which of the 64 bits is the relevant known-defective bit).

At stage 428, in response to the determining at stage 420, and according to the multiplexing signal generated at stage 424, embodiments can output a number of composite data bits onto a composite data bus. For example, the output to the composite bus can effectively function as a stand-in for the output from the primary data block on the primary data bus: when repairs are warranted, the stand-in composite output can include repaired data bits from the repair memory array as replacements for known-defective bits; and when no repairs are warranted, the stand-in composite output can match the output from the primary data block (e.g., effectively as a pass-through of the primary data output). Some embodiments can output the composite bits at stage 428 in accordance with stages 432-440. At stage 432, embodiments can identify a defective one of the primary data bits corresponding to the identified bit position of the known-defective bitcell. At stage 436, one of the repair data bits can be identified according to the identified repair resource (e.g., as a single repair bit from a set of possible repair bits output by the repair memory array, as one of an entire row or column of bits for repair, etc.). At stage 440, embodiments can multiplex the primary data bits (output at stage 408) with one of the repair data bits (output at stage 416) by replacing the identified defective one of the primary data bits with the identified one of the repair data bits.

The methods disclosed herein comprise one or more actions for achieving the described method. The method and/or actions may be interchanged with one another without departing from the scope of the claims. In other words, unless a specific order of actions is specified, the order and/or use of specific actions may be modified without departing from the scope of the claims.

The functions described may be implemented in hardware, software, firmware, mobile, cloud, or any combination thereof. If implemented in software, the functions may be stored as one or more instructions on a tangible computer-readable medium. A storage medium may be any available tangible medium that can be accessed by a computer. By way of example, and not limitation, such computer-readable media can comprise RAM, ROM, EEPROM, CD-ROM, or other optical disk storage, magnetic disk storage, or other magnetic storage devices, or any other tangible medium that can be used to carry or store desired program code in the form of instructions or data structures and that can be accessed by a computer. Disk and disc, as used herein, include compact disc (CD), laser disc, optical disc, digital versatile disc (DVD), floppy disk, and Blu-ray® disc where disks usually reproduce data magnetically, while discs reproduce data optically with lasers.

A computer program product may perform certain operations presented herein. For example, such a computer program product may be a computer readable tangible medium having instructions tangibly stored (and/or encoded) thereon, the instructions being executable by one or more processors to perform the operations described herein. The computer program product may include packaging material. Software or instructions may also be transmitted over a transmission medium. For example, software may be transmitted from a website, server, or other remote source using a transmission medium such as a coaxial cable, fiber optic cable, twisted pair, digital subscriber line (DSL), or wireless technology such as infrared, radio, or microwave.

Further, modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a CD or floppy disk, etc.), such that a user terminal and/or base station can obtain the various methods upon coupling or providing the storage means to the device. Moreover, any other suitable technique for providing the methods and techniques described herein to a device can be utilized.

Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims. "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein may be utilized. Accordingly, the appended claims include within their scope such processes, machines, manufacture, compositions of matter, means, methods, or actions.

What is claimed is:

1. A memory system for centralized block repair in a memory, the system comprising:
    a centralized repair block comprising:
    a repair memory array, coupled with a repair data bus, and comprising a set of repair bitcells arranged into a plurality of repair resources, and operable to output, onto the repair data bus, a set of repair data bits stored in a set of the repair bitcells that corresponds to a memory address signal received substantially concurrently with receipt of the memory address signal by a primary memory block,
    wherein the primary memory block is operable to output, onto a primary data bus in accordance with the memory address signal, a plurality of primary data bits stored in corresponding primary bitcells, such that each of the primary data bits has a respective bit position on the primary data bus;
    a comparison logic circuit operable to generate, in response to determining that the memory address signal is associated with a known-defective bitcell, a multiplexing signal that identifies one of the repair resources and identifies a bit position of the known-defective bitcell; and
    a multiplexer, coupled with the primary data bus, the repair data bus, and the comparison logic circuit, and operable to output, in response to the determining and according to the multiplexing signal, a plurality of composite data bits onto a composite data bus by:
    identifying a defective one of the primary data bits corresponding to the identified bit position of the known-defective bitcell;
    identifying one of the repair data bits according to the identified repair resource; and
    multiplexing the plurality of primary data bits with one of the repair data bits by replacing the identified defective one of the primary data bits with the identified one of the repair data bits.

2. The memory system of claim 1, further comprising the primary memory block.

3. The memory system of claim 1, wherein:
    the repair memory array comprises N repair resources, each being a sub-array of the repair bitcells addressable by the memory address signal; and
    the repair memory array is operable to identify one respective repair bitcell from each of the repair resources as corresponding to the memory address signal, thereby identifying N repair bitcells, and to output the set of repair data bits by outputting N repair data bits stored in the identified N repair bitcells onto the repair data bus.

4. The memory system of claim 1, wherein:
    each repair resource is a sub-array of the repair bitcells addressable by the memory address signal; and
    the repair memory array is operable to identify the set of repair bitcells that corresponds to the memory address signal from among the sub-array of the repair bitcells corresponding to the repair resource identified by the comparison logic circuit.

5. The memory system of claim 1, wherein:
    each repair resource is a row of repair bitcells that duplicates data of a corresponding row of the primary memory block;
    the repair memory array is operable to identify the set of repair bitcells by mapping the memory address signal to one of the rows of repair bitcells according to a mapping stored by the centralized repair block, and to output the set of repair data bits stored in the identified row of repair bitcells.

6. The memory system of claim 1, wherein:
    each repair resource is a column of repair bitcells that duplicates data of a segment of a corresponding column of the primary memory block;
    the repair memory array is operable to identify the set of repair bitcells by mapping the memory address to one of the columns of repair bitcells according to a mapping stored by the centralized repair block, and to output the set of repair data bits stored in the identified column of repair bitcells.

7. The memory system of claim 1, further comprising:
    an address line coupled with the primary memory block and the centralized repair block, the address line operable to receive the memory address signal in association with a memory input/output command.

8. A method for centralized block repair in a memory, the method comprising:
    receiving, substantially concurrently at a primary memory block and at a centralized repair block, a memory address associated with a plurality of primary data bits stored in primary bitcells of the primary memory block;
    outputting the primary data bits from the primary memory block onto a primary data bus in response to the receiving, such that each of the primary data bits has a respective bit position on the primary data bus;
    identifying a set of repair bitcells of a repair memory array of the centralized repair block that correspond to the memory address;
    outputting a set of repair data bits stored in the identified set of repair bitcells onto a repair data bus in response the receiving;
    determining, by a comparison logic circuit of the centralized repair block, that the memory address is associated with a known-defective bitcell;
    generating, by the comparison logic circuit in response to the determining, a multiplexing signal that identifies one of a plurality of repair resources of the repair memory array and identifies a bit position of the known-defective bitcell; and
    outputting, in response to the determining and according to the multiplexing signal, a plurality of composite data bits onto a composite data bus by:

identifying a defective one of the primary data bits corresponding to the identified bit position of the known-defective bitcell;

identifying one of the repair data bits according to the identified repair resource; and multiplexing the plurality of primary data bits with one of the repair data bits by replacing the identified defective one of the primary data bits with the identified one of the repair data bits.

9. The method of claim 8, wherein:

the repair memory array comprises N repair resources, each being a sub-array of the repair bitcells addressable by the memory address;

the identifying the set of repair bitcells comprises identifying one respective repair bitcell from each of the repair resources as corresponding to the memory address, thereby identifying N repair bitcells;

the outputting the set of repair data bits comprises outputting N repair data bits stored in the identified N repair bitcells onto the repair data bus.

10. The method of claim 8, wherein:

each repair resource is a sub-array of the repair bitcells addressable by the memory address;

the identifying the set of repair bitcells comprises identifying the set of repair bitcells that corresponds to the memory address from among the sub-array of the repair bitcells corresponding to the repair resource identified by the comparison logic circuit.

11. The method of claim 8, wherein:

each repair resource is a row of repair bitcells that duplicates data of a corresponding row of the primary memory block;

the identifying the set of repair bitcells comprises mapping the memory address to one of the rows of repair bitcells according to a mapping stored by the centralized repair block; and the outputting the set of repair data bits comprises outputting the repair data bits stored in the identified row of repair bitcells onto the repair data bus.

12. The method of claim 8, wherein:

each repair resource is a column of repair bitcells that duplicates data of a segment of a corresponding column of the primary memory block;

the identifying the set of repair bitcells comprises mapping the memory address to one of the columns of repair bitcells according to a mapping stored by the centralized repair block; and the outputting the set of repair data bits comprises outputting the repair data bits stored in the identified column of repair bitcells onto the repair data bus.

13. The method of claim 11, wherein:

the memory address comprises row address bits and column address bits; and the mapping comprises translating at least one of the set of row address bits into a column muxing selector.

14. The method of claim 8, wherein:

the memory address comprises X row address bits and Y column address bits, each column having Z bitcells, thereby addressing 2^X by (2^Y*Z) bitcells in each of a plurality of banks of the primary memory block;

the primary data bus is Z bits wide;

the repair memory array comprises N repair resources, each being a sub-array of the repair bitcells having 2^M repair rows and 2^Y repair columns;

the repair data bus is N bits wide; and the composite data bus is Z bits wide.

15. The method of claim 14, wherein the number of repair rows in each repair resource (2^M) equals the number of rows in each bank of the primary memory block (2^X).

16. The method of claim 8, wherein:

the primary memory block and the centralized repair block are both coupled with an address line; and the memory address is received via the address line.

17. The method of claim 8, wherein:

the primary memory block operates with multi-cycle throughput; and the repair memory array operates with single-cycle throughput.

18. The method of claim 8, wherein:

the primary memory block comprises a plurality of banks accessible by bank interleaving.

19. The method of claim 8, wherein:

the primary bitcells and the repair bitcells are of a same bitcell type.

* * * * *